United States Patent [19]
White et al.

[11] Patent Number: 5,589,423
[45] Date of Patent: Dec. 31, 1996

[54] PROCESS FOR FABRICATING A NON-SILICIDED REGION IN AN INTEGRATED CIRCUIT

[75] Inventors: Ted R. White; Ting-Chen Hsu; Bradley M. Somero; Mark A. Chonko; Jung-Hui Lin, all of Austin, Tex.

[73] Assignee: Motorola Inc., Schaumburg, Ill.

[21] Appl. No.: 317,045

[22] Filed: Oct. 3, 1994

[51] Int. Cl.$^6$ ............ H01L 21/70; H01L 27/00; H01L 21/465; H01L 21/306

[52] U.S. Cl. ............ 437/228; 437/51; 437/54; 437/200; 156/643.1

[58] Field of Search ............ 437/60, 924, 235, 437/228, 200, 52, 54, 51, 228 PE, 228 M; 156/643.1

[56] References Cited

U.S. PATENT DOCUMENTS

| | | | |
|---|---|---|---|
| 3,922,184 | 11/1975 | Baker et al. | 437/228 |
| 4,222,816 | 9/1980 | Noble, Jr. et al. | 437/228 M |
| 4,342,617 | 8/1982 | Fu et al. | 156/643.1 |
| 4,440,804 | 4/1984 | Milgram | 427/91 |
| 4,943,538 | 7/1990 | Mohsen et al. | 437/52 |
| 4,985,374 | 1/1991 | Tsuji et al. | 437/241 |
| 5,021,853 | 6/1991 | Mistry | 357/23.13 |
| 5,298,463 | 3/1994 | Sandhu et al. | 437/200 |
| 5,320,932 | 6/1994 | Haraguchi et al. | 437/228 |
| 5,399,532 | 3/1995 | Lee et al. | 437/235 |

OTHER PUBLICATIONS

Stanley Wolf and Richard N. Tauber, *Silicon Processing for the VLSI Era*, vol.1, p. 546, 1986.
David Krakauer, "ESD Protection in a 3.3V Sub-Micron Silicided CMOS Technology", EOS/ESD Symposium 1992–250, pp. 5B4.1–5B.4.8.

*Primary Examiner*—Mary Wilczewski
*Assistant Examiner*—Brian K. Dutton
*Attorney, Agent, or Firm*—Jasper W. Dockrey

[57] ABSTRACT

A process for the fabrication of a non-silicided region in an integrated circuit includes the fabrication of a silicide blocking layer (24, 46, 54, 92, 112). In one embodiment, a field transistor (80) is formed by depositing a silicide blocking layer (84) overlying a field gate electrode (70) and source and drain regions (76, 78). A carbonaceous mask (86) is formed on the silicide blocking layer (84) overlying the field transistor (80). A partial etching process is performed to remove a portion of the silicide blocking layer (84) exposed by the carbonaceous mask (86). Then, the carbonaceous mask (86) is removed and the etching process is continued to completely remove portions of the silicide blocking layer (84) not originally protected by the carbonaceous mask (86). The etching process forms a silicide blocking layer (92) overlying the field transistor (80) and sidewall (94) adjacent to an MOS gate electrode (68).

16 Claims, 3 Drawing Sheets

PROCESS FOR FABRICATING A NON-SILICIDED REGION IN AN INTEGRATED CIRCUIT

RELATED APPLICATION

Related subject matter is disclosed in the co-pending, commonly assigned patent application having Ser. No. 08/650,581, and filed Sep. 6, 1994.

FIELD OF THE INVENTION

This invention relates, in general, to a process for fabricating a semiconductor device, and more particularly, to a process for fabricating a non-silicided region in an integrated circuit.

BACKGROUND OF THE INVENTION

The trend in the integrated circuit industry is toward the fabrication of integrated circuit devices having increased levels of performance. One method of achieving higher performance is to reduce the electrical resistance of the components in the integrated circuit. Typically, a metal-oxide-semiconductor (MOS) transistor includes a polycrystalline silicon gate electrode, and source and drain regions residing in a silicon substrate. The performance of an MOS transistor can be improved by reducing the electrical resistance within the transistor. One method for reducing the electrical resistance is to heavily dope both the gate electrode and the source and drain regions with a dopant, such as arsenic, phosphorus, and boron. However, once the solid solubility limit of the dopant is reached, the electrical resistance is not reduced by the further addition of dopants to the silicon substrate. Accordingly, integrated circuit designers employ refractory metal silicides to further reduce the electrical resistance and increase the performance.

Although the use of refractory metal silicides has led to improved device performance, the presence of low resistance silicide regions has reduced the ability of integrated components to withstand high voltage and current transients caused by an electrostatic discharge. This is true in part because the lower electrical resistance of the silicided regions enables the device to conduct a large electrical current. During an electrostatic discharge event, a transient voltage pulse can cause a large current to be conducted through an MOS transistor and into thin metal leads. The high electrical current can be sufficient to the melt metal leads, and to create voids in the interconnect metallization. Further, the high current levels can conglomerate the silicide in the source and drain regions creating current leakage paths. Thus, in the worst case, the thermal affects of the electrostatic discharge event can cause complete device failure.

One method of reducing the deleterious affects of an electrostatic discharge event is to provide protection devices in the integrated circuit. Typically, a protection device, such as a diffused resistor, or a gate-clamped MOS transistor, is provided between an input-output (I/O) pad and sensitive circuit elements. However, the ability of the protection devices to prevent transient voltage spikes from being transmitted from the I/O pad to a sensitive circuit is compromised if the protection device also contains silicided components. Accordingly, a silicide blocking layer is placed over functional regions of the protection device to prevent the silicidation of the protection devices.

Although the formation of a silicide blocking layer is effective in preventing the silicidation of protection devices, the processing steps necessary to form the blocking layer can result in substantial degradation of the substrate and overlying dielectric layers. Accordingly, improved processing methods are necessary to enable the formation of silicide blocking layers in an electrostatic discharge protection device.

SUMMARY OF THE INVENTION

In practicing the present invention there is provided a process for fabricating a non-silicided region in an integrated circuit. Using the fabrication process of the invention, a resistor, or an electrostatic discharge protection device can be fabricated in an integrated circuit, or the like, while not increasing the number or complexity of fabrication steps needed to build the integrated circuit. Furthermore, the process of the invention provides an improved electrostatic protection device by avoiding the removal of dielectric layers protecting the substrate surface during the fabrication process. During the etching process used to form a silicided blocking layer, a thin dielectric layer protects the substrate surface from damage by chemicals used in the etching process.

The inventive process includes providing a substrate having a silicide blocking layer overlying a portion of the substrate surface. A carbonaceous mask is formed to overlie a first portion of the silicide blocking layer, while leaving a second portion of the silicide blocking layer exposed. The second portion of the silicide blocking layer is then partially etched using the carbonaceous mask as an etching mask. After etching away part of the second portion of the silicide blocking layer, the carbonaceous mask is removed and remaining portions of the second portion of the silicide blocking layer are etched away. By removing the carbonaceous mask after partially etching the second portion of the silicide blocking layer, the substrate surface is protected from attack by chemical etchants after the second portion of the silicide blocking layer is etched away.

Figure 1:
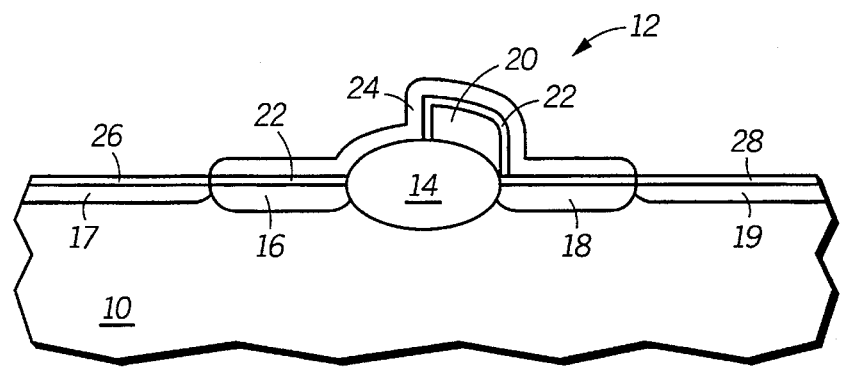
FIG. 1 illustrates, and cross-section, a field transistor fabricated in accordance with the invention.

It will be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the figures to indicate corresponding elements.

DETAILED DESCRIPTION OF THE PREFERRED EMBODIMENTS

The present invention provides a process for fabricating a non-silicided region in an integrated circuit. The process of the invention can be employed in the fabrication of a resistor or an electrostatic discharge protection device, or the like. The process of the invention provides a silicide blocking layer overlying selected portions of an integrated circuit. The process includes a two-step etching process for the formation of the silicide blocking layer. The two-step etching process defines a silicide blocking layer over selected portions of an electrostatic discharge prevention device, while avoiding the degradation of portions of the substrate surface not covered by the silicide blocking layer.

Figure 2:
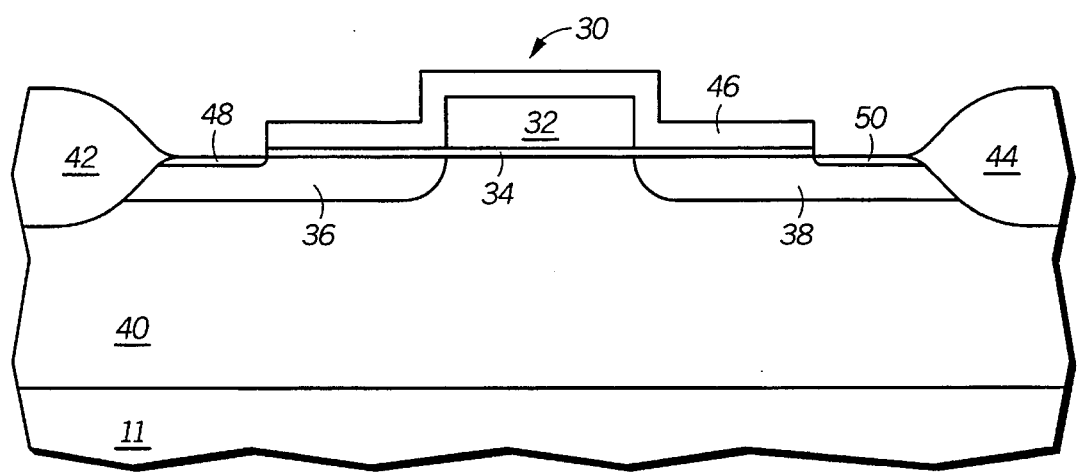
FIG. 2 illustrates, in cross-section, a thin-gate-oxide transistor fabricated in accordance with the invention.
Figure 3:
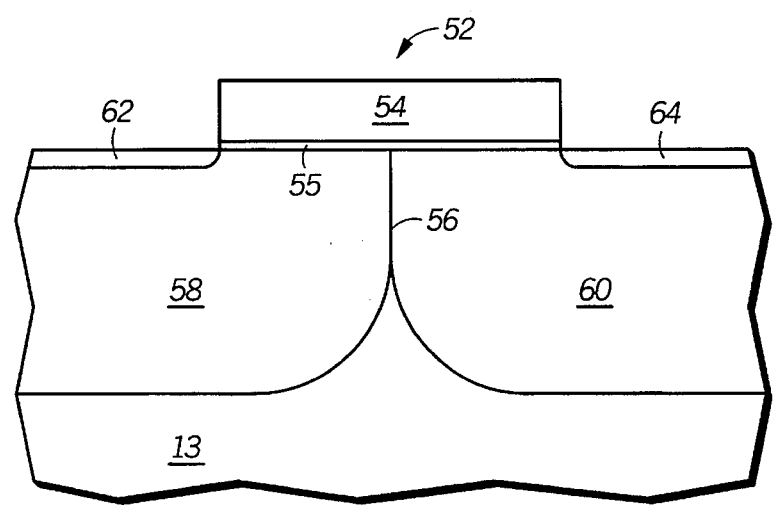
FIG. 3 illustrates, in cross-section, a Schottkey diode fabricated in accordance with the invention.

FIGS. 1–3 illustrate, in cross-section, examples of electrostatic discharge protection devices to which the present invention is applicable, and which are fabricated in accordance with the invention. Show in FIG. 1 is a field transistor 12 formed in a portion of a semiconductor substrate 10. Field transistor 12 includes a dielectric isolation region 14 positioned intermediate to source and drain regions 16 and 18, respectively, and to their extension regions 17 and 19. A field gate electrode 20 overlies a portion of dielectric isolation region 14 and provides voltage control through a portion of the substrate underlying field isolation region 14. A dielectric layer 22 overlies the surface of field electrode 20 and portions of the substrate surface above source and drain regions 16 and 18. A silicide blocking layer 24 overlies dielectric layer 22 and covers source and drain regions 16 and 18, respectively, field gate electrode 20, and the remaining surface area of dielectric isolation region 14. Portions of the surface substrate 10 not covered by silicide blocking layer 24 contain silicide regions 26 and 28.

Field transistor 12 is a resistive load transistor in which field gate electrode 20 is coupled to source region 16, which in turn is connected to ground potential (not shown). Accordingly, field transistor 12 provides high electrical resistance between silicide regions of 26 and 28. The high electrical resistance of field transistor 12 prevents a voltage transient, originating from an electrostatic discharge event, from being propagated through substrate 10 between silicide regions 26 and 28. The electrical resistance of field transistor 12 is increased by blocking the silicidation of source and drain regions 16 and 18. During the silicidation of the surface of substrate 10, silicide blocking layer 24 prevents the formation of silicide regions at the surfaces of source and drain region 16 and 18, and at the surface of field gate electrode 20. The high electrical resistance attained by field transistor 12 enables the transistor to shunt a high level of current during an electrostatic discharge event, while avoiding the propagation of electrical current between silicide regions 26 and 28. As will subsequently be described, in accordance with the invention a two-step etching process is carried out to form silicide blocking layer 24 without damaging the surface of substrate 10 beneath silicide regions 26 and 28.

A thin-gate-oxide electrostatic discharge transistor 30 is illustrated in FIG. 2. Thin-gate-oxide transistor 30 includes a gate electrode 32 overlying a thin-gate-oxide layer 34. Source and drain regions 36 and 38 reside in a P-well region 40 formed in a semiconductor substrate 11. Field oxide regions 42 and 44 reside at the surface of P-well region 40 on either side of transistor 30. Thin-gate-oxide transistor 30 is similar to field transistor 12 in that thin-gate-oxide transistor 30 is also a resistive element, where gate electrode 32 and source region 36 are grounded (not shown). A silicide blocking layer 46 overlies gate electrode 32 and a portion of source and drain regions 36 and 38, respectively, adjacent to gate electrode 32. A silicide region 48 resides at a surface portion of source region 36 not covered by silicide blocking layer 46. Correspondingly, a silicide region 50 resides in a portion of the surface of drain region 38 not covered by silicide blocking layer 46.

Silicide blocking layer 46 creates regions of relatively high electrical resistance adjacent to gate electrode 32 by preventing the formation of silicide surface regions in portions of the source and drain regions adjacent to gate electrode 32. As will subsequently be described, in accordance with the invention a two-step etching process is carried out to form silicide blocking layer 46 without damaging the substrate surface beneath silicide regions 48 and 50. Both field transistor 12 and transistor 30 can be used in a variety of locations within an MOS integrated circuit and coupled to other components, such as resistors, and inverters, and the like, to protect these circuit elements from damage by electrostatic discharge.

A Schottkey diode-type electrostatic discharge protection device is illustrated in FIG. 3. Schottkey diode 52 is formed in a semiconductor substrate 13 and includes a silicide blocking layer 54 overlying a P-N junction 56. Silicide blocking layer 54 is sepatated from substrate 13 by a gate oxide layer 55. P-N junction 56 resides at the interface of a P-type region 58 and an N-type region 60. A silicide region 62 resides at the surface of P-type region 58, and a silicide region 64 resides at the surface of N-type region 60. During fabrication, silicide blocking layer 54 prevents the silicidation of a portion of P-type region 58 and N-type region 60 adjacent to P-N junction 56. By preventing the silicidation of the substrate surface near P-N junction 56, the current blocking capability of Schottkey diode 52 is not compromised. Silicide regions 62 and 64 are sufficiently spaced apart from P-N junction 56 by silicide blocking layer 54 to avoid the creation of a current conduction path across P-N junction 56.

While the electrostatic discharge protection devices illustrated in FIGS. 1–3 all provide a means of creating a region of high electrical resistance in a semiconductor substrate, the fabrication process must be carefully designed to avoid process induced degradation of device performance. The process of the present invention can be used to form a silicide blocking layer while preserving the integrity of the substrate surface.

Illustrated in FIGS. 4a–4f are process steps, in accordance with one embodiment of the invention, for the fabrication of a field transistor similar to that illustrated in FIG. 1. Those skilled in the art will recognize that the process described for the fabrication of a field transistor is directly applicable to the fabrication of a thin-gate-oxide transistor, a Schottkey diode protection device, and the like.

Figure 4A:
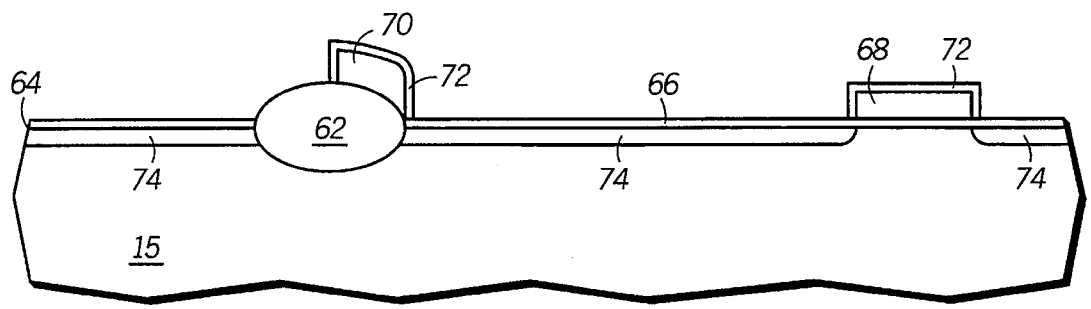
FIGS. 4a–4f illustrate, in cross-section, process steps in accordance with the invention for the fabrication of an electrostatic discharge protection device.

Shown in FIG. 4a is a portion of a semiconductor substrate 15 having already undergone several process steps in accordance with the invention. A dielectric isolation region 62 resides at a surface 64 of substrate 15 and a gate oxide layer 66 overlies substrate surface 64. An MOS gate electrode 68 is spaced away from dielectric isolation region 62 and separated from substrate surface 64 by gate oxide layer 66. A field gate electrode 70 overlies a portion of dielectric isolation region 62. A dielectric layer 72 overlies field gate electrode 70 and MOS gate electrode 68. A lightly doped drain region 74 resides in semiconductor substrate 15 on either side of MOS gate electrodes 68, and on either side of dielectric isolation region 62.

The features illustrated in FIG. 4a can be fabricated using conventional process techniques. For example, dielectric isolation region 62 is preferably formed by a high temperature thermal oxidation process in a steam ambient. The oxidation conditions employed grow an oxide layer to a thickness of about 5000 to 8000 angstroms. Gate oxide layer 66 is preferably formed by a dry thermal oxidation process.

Then, MOS gate electrode 68 and field gate electrode 70 are formed by the chemical vapor deposition of a layer of polycrystalline silicon followed by photolithographic patterning and reactive ion etching. A second dry thermal oxidation process is then performed to form dielectric layer 72, and to re-grow portions of gate oxide layer 66 removed during previous processing. Lightly doped regions 74 are formed by ion implantation of a dopant species into semiconductor substrate 15. The ion implantation process self-aligns lightly doped regions 74 to both MOS gate electrode 68, and to dielectric isolation regions 62.

Figure 4B:
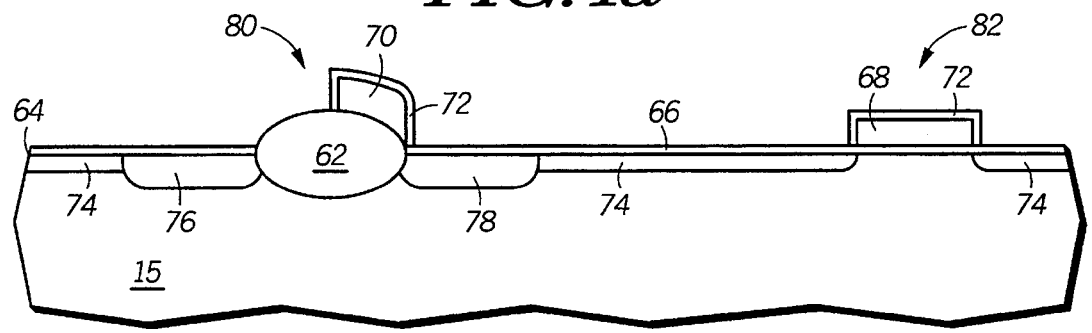

After forming lightly doped regions 74, a photolithographic graphic pattern (not shown) is formed on semiconductor substrate 15, and an ion implantation process is carried out to form source and drain regions 76 and 78, respectively, as illustrated in FIG. 4b. Field gate electrode 70, dielectric isolation region 62, and source and drain region 76 and 78 form a field transistor 80. Those skilled in the art will appreciate that field transistor 80 can be of either N-type conductivity, or P-type conductivity. In a preferred embodiment of the invention, field transistor 80 is an N-type transistor including N-type source and drain regions formed in a P-type substrate. Accordingly, source and drain regions 76 and 78 are formed by the implantation of an N-type dopant, such as phosphorus or arsenic. Further, field gate electrode 70 is preferably doped with an N-type, such as phosphorus. Also, in the preferred embodiment, MOS gate electrode 68 and lightly doped region 74 are elements of an N-type MOS transistor 82.

Figure 4C:
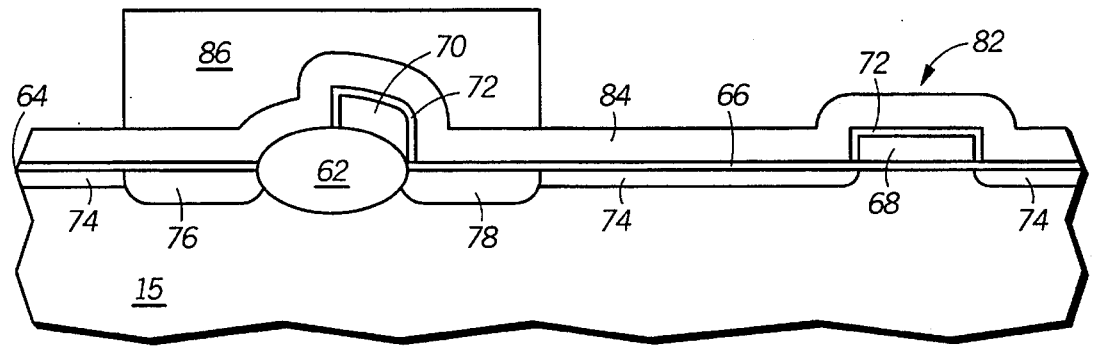

The process of the invention continues with the deposition of a silicide blocking material 84 onto semiconductor 15, as illustrated in FIG. 4c. Preferably, silicide blocking layer 84 is formed by the chemical vapor deposition of a dielectric material capable of preventing a reaction between a refractory metal and silicon. In a preferred embodiment of the invention, silicide blocking material is silicon nitride chemical vapor deposited to a thickness of about 500 to 3000 angstroms. Alternatively, silicide blocking layer 84 can be another dielectric material capable of sealing substrate surface 64 and preventing a silicide reaction. Accordingly, silicide blocking layer 84 can be another dielectric material such as titanium dioxide, aluminum oxide, and the like. Although chemical vapor deposition is a preferred means for the deposition of silicide blocking layer 84, another deposition technique can also be used, such as RF sputtering, and reactive sputter deposition, and the like.

Following the deposition of silicide blocking layer 84, an etching mask 86 is formed to overlie a portion of silicide blocking material 84. Etching mask 86 substantially overlies field transistor 80 and is aligned to the outside edges of source and drain regions 76 and 78. Etching mask 86 is most commonly a positive acting photoresist material, which includes a polymer matrix and a photosensitizing compound. In many positive acting photoresist compounds, the polymer matrix is a novolak resin prepared by an acid catalyzed copolymerization reaction of cresol and formaldehyde. The sensitizer is typically diazonaphthoquinone (DNQ). Upon exposure to the proper wave length of light, the sensitizer undergoes photolysis to produce a carbine, which then undergoes a Wolff rearrangement to form a ketene. Both the novolak resin and the DNQ sensitizer are organic molecular complexes containing substantial quantities of carbon. Accordingly, for the purposes of the following description, etching mask 86 will be referred to as a carbonaceous mask. Those skilled in the art will recognize that many other types of photoresist are commonly used in integrated circuit fabrication, including negative reacting photoresist compounds, chemically amplified photoresist compounds, and the like. However, all such photoresist compounds include substantial quantities of carbon and therefore are also included within the range of materials providing a carbonaceous mask in the present invention.

Figure 4D:
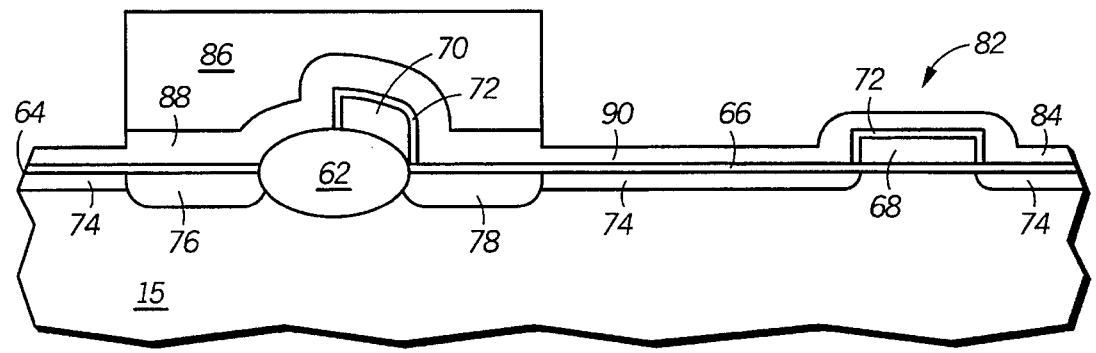

Referring to FIG. 4d, after forming carbonaceous mask 86, a partial etch is carried out to reduce the thickness of silicide blocking layer 84 in areas not protected by carbonaceous mask 86. Preferably, the etching process removes about 250 to 1500 angstroms from exposed areas of silicide blocking material 84. The partial etching process creates a first portion 88 of silicide blocking layer 84 overlying field transistor 80, and a second portion 90 overlying remaining portions of semiconductors substrate 15, including MOS gate electrode 68 and lightly doped regions 74.

The partial etching process is carried out by first determining the etch rate of the particular etching chemistry used to remove portions of silicide blocking layer 84. In a preferred embodiment, where silicide blocking layer 84 is silicon nitride, a reactive ion etch is used which employs the noncarbonaceous etching gases, silicon tetrafluoride ($SiF_4$), nitrogen trifluoride ($NF_3$), hydrogen bromide (HBr), and oxygen ($O_2$). Under predetermined conditions of RF power and chamber pressure, the etch rate of the silicide blocking layer is first determined. Then, the etching process is carried out for a predetermined time to remove a specified amount of material. In the preferred embodiment of the invention, using etching gases given above, at about 400 watts RF power, and a chamber pressure of about 140 millitorr, silicon nitride is etched at an etch rate of about 800 angstroms/min.

Those skilled in the art will appreciate that the fluorinated etching species of the present invention can also be used to etch the other dielectric materials contemplated for use as silicide blocking materials in the present invention. These materials include titanium dioxide, aluminum oxide, and the like. Furthermore, operating conditions other than those previously described can be used to etch the various dielectric materials employed as a silicide blocking layer in the present invention.

Figure 4E:
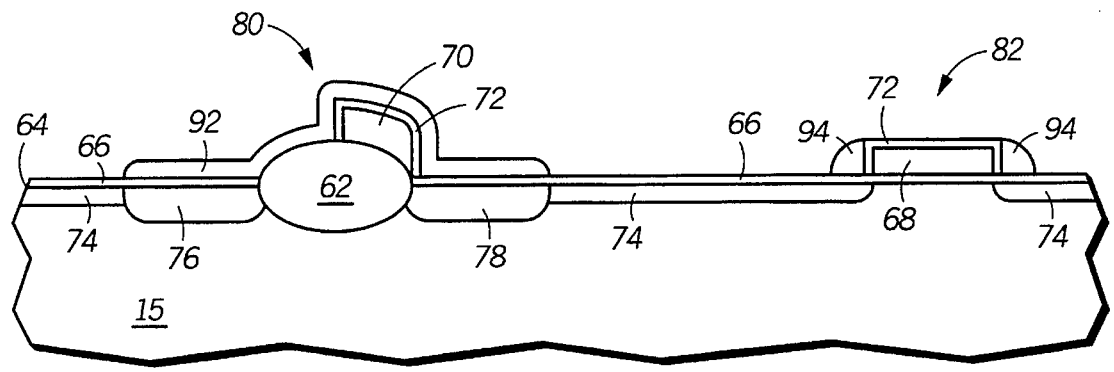
Figure 4F:
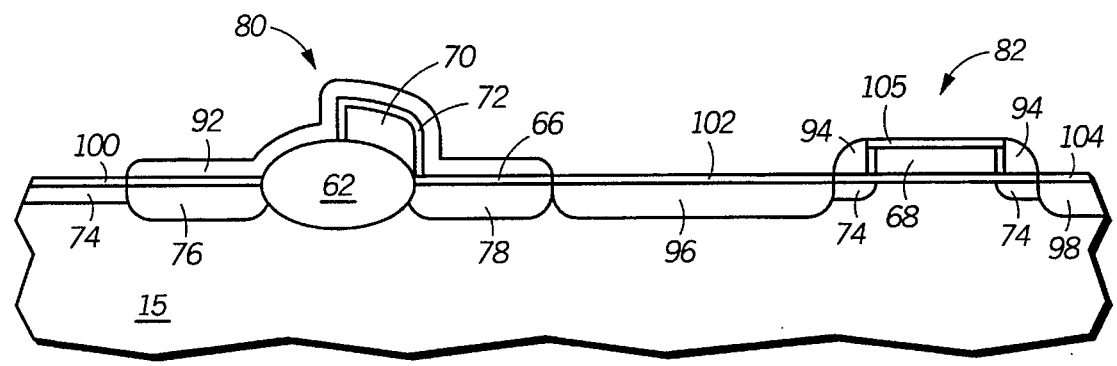

After partially etching silicide blocking layer 84, carbonaceous mask 86 is removed and the etching process is resumed. The completed etching process forms a silicide blocking layer 92 overlying field transistor 80 and side wall spacers 94 adjacent to MOS gate electrode 68, as illustrated in FIG. 4e. It is important to note that the etching method of the invention does not result in the unwanted removal of any portion of gate oxide layer 66, nor any damage to substrate surface 64 underlying gate oxide layer 66. In contradistinction to fabrication methods of the prior art, the etching process of the invention avoids deleterious affects to exposed portions of the substrate surface, and to the dielectric layers overlying the substrate.

The improved fabrication process of the invention is realized, in part, by the removal of carbonaceous mask 86 prior to exposing portions of substrate gate oxide layer 66 during the etching process. In the preferred plasma etching process, oxygen is employed to increase the selectivity of the etch to silicon dioxide. However, oxygen can react with hydrocarbon compounds in the photoresist. The presence of carbon in the etching plasma can result in a rapid increase in the etch rate of silicon dioxide and lead to pitting of the substrate surface. A possible reaction may be expressed as follows:

$$(R)_2CH_2 + XO_2 \rightarrow YCO_2 + H_2O \tag{1}$$

where R represents an organic complex constituent present in the photoresist and X and Y are positive integers. In reaction (1), the oxygen reacts with carbon in the photoresist. The oxidation reaction removes oxygen from the plasma and the selectivity of the etching process to silicon dioxide declines. As the selectivity of the etching process to silicon dioxide decreases, the silicon dioxide etch rate increases. If the silicon dioxide etch rate is appreciable, the silicon dioxide overlying the substrate will be removed and the underlying silicon etched by the fluorinated components in the plasma. The removal of carbonaceous mask 86 prior to the completion of the etching process removes a source of carbon within the etching plasma and increases the selectivity of the etching process.

Also, carbon is known to react with silicon dioxide to produce elemental silicon. A possible reaction may be expressed as follows:

$$C + SiO_2 \rightarrow CO_2 + Si \qquad (2)$$

Carbon can be released from the photoresist during the etching process, either by the mechanism shown in reaction (1), or by another mechanism. It is believed that etching conditions in the presence of a carbonaceous material, such as photoresist or a carbonaceous etching gas, produce an environment favorable to reactions (1) and (2). Since the preferred plasma etching chemistry is selected from non-carbonaceous species, carbonaceous mask 86 represents the only source of carbon in the plasma etching reaction. By removing the carbonaceous mask 86 prior to exposure of gate oxide layer 66, the selectivity of the etch to the silicon dioxide is maintained at a high level. Further, by avoiding the unwanted etching of gate oxide layer 66, substrate surface 64 is protected from attack by etching gases after second portion 90 of silicide blocking layer 84 is removed.

Referring to 4f, the fabrication process of the invention is completed with the formation of source and drain regions 96 and 98 for MOS transistor 82, and silicide regions 100, 102, 104, and 105. Source and drain regions 96 and 98 are preferably formed by ion implantation using MOS gate electrode 68 and sidewall spacers 94 as an implant mask. The self-aligned implant aligns the edges of source and drain region 96 and 98 to sidewall spacers 94. Prior to performing the implant, portions of substrate 15 away from MOS transistor 82 are covered by an implant masking layer to block the implantation of those regions.

After forming the source and drain regions, a silicidation process is carried out to form silicide regions 100, 102, 104, and 105. First, the exposed portions of gate oxide layer 66 and dielectric layer 72 are removed and a refractory metal layer is deposited to overlie the surface of substrate 15. Then, thermal energy is applied to react the refractory metal with silicon in substrate 15 and form a refractory metal silicide. A refractory metal silicide is not formed in regions of the substrate protected by silicide blocking layer 92, nor those regions covered by a dielectric layer.

The process steps shown in FIGS. 4a–4f illustrate one embodiment of a process for the fabrication of an MOS transition adjacent to a field transistor. In the preferred embodiment, silicide blocking layer 84 is processed to form both silicide blocking layer 92 and sidewall spacers 94. In an alternative method, a different material can be used to form sidewall spacers 94 adjacent to MOS gate electrode 68. In this case, separate deposition and etching steps are carried out either before or after forming silicide blocking layer 92. For example, after forming silicide blocking layer 92, a layer of silicon dioxide can be deposited to overlie MOS gate electrode 68, followed by an anisotropic etching process to form the sidewall spacers. While process variations are possible, the preferred embodiment in which the same material is used for both side wall spacers and as a silicide blocking layer provides a simplified process. It is important to note that the process of the present invention does not require any extra processing steps to form both a sidewall spacer on an MOS electrode, and a silicide blocking layer.

Those skilled in the art will recognize that the basic element common to the previously described electrostatic discharge protection devices is a resistive region located intermediate to two or more substrate regions having a low electrical resistance. The feature common to all electrostatic discharge protection devices is a diffused resistor.

Figure 5:
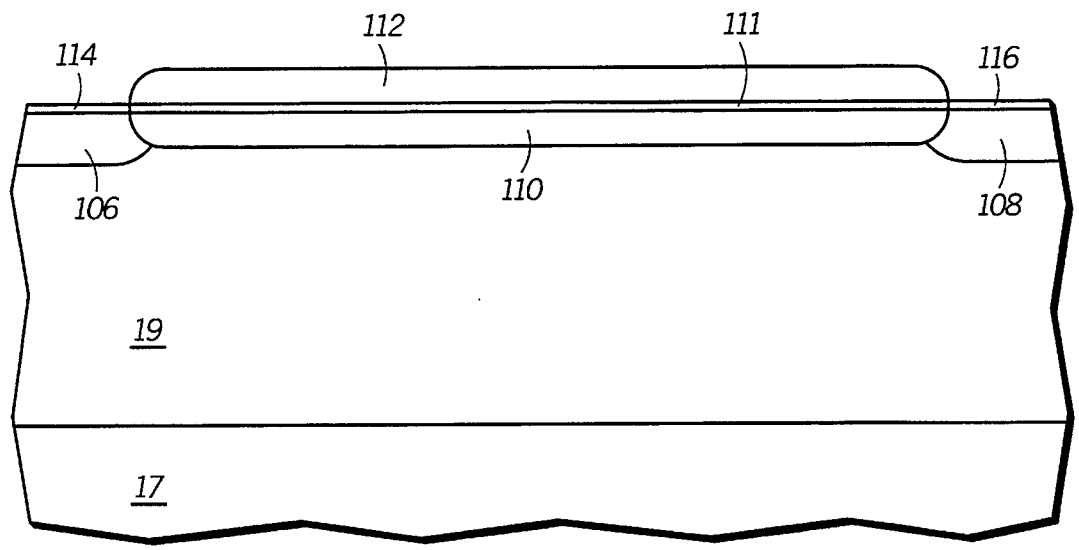
FIG. 5 illustrates, in cross-section, a diffused resistor fabricated in accordance with the invention.

A diffused resistor formed in accordance with the invention is illustrated in FIG. 5. Electrostatic discharge protection is provided by a diffused resistor 110 formed in a well region 19 and positioned between source and drain regions 106 and 108, respectively. Well region 19 resides within a semiconductor substrate 17, and a dielectric layer 111 overlies the surface of well region 19. Silicide regions 114 and 116 reside at the surface of the source and drain regions 106 and 108, respectively.

Diffused resistor 110 is fabricated by first implanting well region 19 with an N-type dopant, such as phosphorus or arsenic. Then, a silicide blocking layer is deposited, and the sequential etching process illustrated in FIGS. 4c, 4d, and 4e is carried out to form silicide blocking layer 112. Next, an ion implantation process is carried out to form source and drain regions 106 and 108. Finally, a silicidation process is performed to form silicided regions 114 and 116.

The fabrication of a simple resistor element for the purpose of electrostatic discharge protection, together with the other foregoing examples, illustrates the wide applicability of the process of the present invention for the fabrication electrostatic discharge protection devices. Furthermore, the process can be applied to different types of silicide blocking materials overlying silicon dioxide layers, and to different non-carbonaceous etching chemistry. For example, etching processes using sulfur hexafluoride ($SF_6$), chlorine (Cl), hydrogen chloride (HCl), and the like, are also within the scope of the present invention.

Thus it is apparent that there has been provided, in accordance with the invention, a process for fabricating an electrostatic discharge protection device in a silicided integrated circuit, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, electron cyclotron resonance etching techniques and deep ultraviolet lithography can be used. It is therefore intended to include within the invention all such variations and modifications as fall within the scope of the appended claims and equivalents thereof.

We claim:

1. A process for fabricating a non-silicided region in an integrated circuit comprising the steps of:

providing a substrate having a silicide blocking layer overlying a dielectric layer;

forming a carbonaceous mask on a first portion of the silicide blocking layer and leaving a second portion exposed;

partially etching the second portion of the silicide blocking layer using the carbonaceous mask as an etching mask;

removing the carbonaceous mask;

etching away the second portion of the silicide blocking layer, after removing the carbonaceous mask, to expose a portion of the dielectric layer;

etching away the portion of the dielectric layer; and forming a silicide layer in the portion of the substrate, after etching away the portion of the dielectric layer.

2. The process of claim 1, wherein the steps of partially etching and etching comprise reactive ion etching using a non-carbonaceous gaseous mixture.

3. The process of claim 1, wherein the step of forming a carbonaceous mask comprises forming a patterned layer of photoresist on the silicide blocking layer.

4. The process of claim 1, wherein the step of providing a silicide blocking layer comprises depositing a layer of silicon nitride.

5. A process for fabricating a non-silicided region in an integrated circuit comprising the steps of:

providing a substrate having a first region adjacent to a second region, and a junction intermediate to the first and second regions;

forming a silicide blocking layer overlying the substrate;

forming a carbonaceous mask on a first portion of the silicide blocking layer overlying the junction and a portion of the first and second regions adjacent to the junction, and leaving a second portion of the silicide blocking layer exposed;

partially etching the second portion of the silicide blocking layer using the carbonaceous mask as an etching mask;

removing the carbonaceous mask;

etching away the second portion of the silicide blocking layer, after removing the carbonaceous mask, to expose a portion of the first and second regions; and forming a silicide layer in the portion of the substrate, after etching away the second portion of the silicide blocking layer.

6. The process of claim 5, wherein the step of forming a carbonaceous mask comprises forming a patterned layer of photoresist on the silicide blocking layer.

7. The process of claim 6, wherein the steps of partially etching and etching comprise reactive ion etching using a non-carbonaceous gaseous mixture.

8. The process of claim 7, wherein the step of providing a silicide blocking layer comprises depositing a layer of silicon nitride.

9. A process for fabricating a non-silicided region in an integrated circuit comprising the steps of:

providing a substrate having a surface and having a field oxide region at the substrate surface;

forming a field gate electrode overlying a portion of the field oxide region;

forming a dielectric layer overlying the field gate electrode and the substrate surface;

forming a silicide blocking layer on the dielectric layer;

forming a carbonaceous mask on a first portion of the silicide blocking layer, the first portion overlying the field gate electrode, the field oxide region, and a portion of the substrate adjacent to the field oxide region, and leaving a second portion exposed;

partially etching the second portion of the silicide blocking layer using the carbonaceous mask as an etching mask;

removing the carbonaceous mask;

etching away the second portion of the silicide blocking layer, after removing the carbonaceous mask, to expose a portion of the dielectric layer;

etching away the portion of the dielectric layer; and forming a silicide layer in the portion of the substrate, after etching away the portion of the dielectric layer.

10. The process of claim 9, wherein the steps of partially etching and etching comprise reactive ion etching using a gaseous mixture having fluorinated etching species as one component and oxygen as another component.

11. The process of claim 9, wherein the step of forming a field gate electrode further comprises forming an MOS gate electrode overlying the substrate surface and spaced away from the field gate electrode.

12. The process of claim 11, wherein the step of etching away the second portion of the silicide blocking layer further comprises forming sidewall spacers adjacent to the MOS gate electrode.

13. A process for fabricating a non-silicided region in an integrated circuit comprising the steps of:

providing a substrate having a substrate surface and having a field oxide region at the substrate surface;

forming a field gate electrode overlying a portion of the field oxide region;

forming an MOS gate electrode overlying the substrate surface and spaced away from the field gate electrode;

forming a dielectric layer overlying the field gate electrode, the MOS gate electrode, and the substrate surface;

forming a silicide blocking layer overlying the dielectric layer;

forming a carbonaceous mask on a first portion of the silicide blocking layer, the first portion overlying the MOS gate electrode, the field oxide region, and a portion of the substrate adjacent to the field oxide region, and leaving a second portion exposed;

reactive ion etching using a gaseous mixture having fluorinated etching species as one component and oxygen as another component to partially etch the second portion of the silicide blocking layer using the carbonaceous mask as an etching mask;

removing the carbonaceous mask;

reactive ion etching using the gaseous mixture to etch away the second portion of the silicide blocking layer;

forming sidewall spacers adjacent to the MOS gate electrode;

removing portions of the dielectric layer exposed by the first portion of the silicide blocking layer and by the sidewall spacers to expose portions of the substrate surface; and forming silicide regions in expose portions of the substrate surface, after removing the portions of the dielectric layer, wherein the first portion of the silicide blocking layer and the sidewall spacers prevent the formation of a silicide regions in the substrate underlying the first portion of the silicide blocking layer and the sidewall spacers.

14. A process for fabricating a non-silicided region in an integrated circuit comprising the steps of:

providing a substrate containing an electrostatic discharge protection transistor, the electrostatic discharge protection transistor including a gate electrode and a source region and a drain region on opposite sides of the gate electrode;

forming a silicide blocking layer to overlie the electrostatic discharge protection transistor;

forming a carbonaceous mask on a first portion of the silicide blocking layer overlying the gate electrode and a portion of the source and drain regions adjacent to the gate electrode, and leaving a second portion of the silicide blocking layer exposed;

partially etching the second portion of the silicide blocking layer using the carbonaceous mask as an etching mask;

removing the carbonaceous mask;

etching away the second portion of the silicide blocking layer, after removing the carbonaceous mask, to expose a portion of the substrate; and forming a silicide layer in the portion of the substrate, after etching away the second portion of the silicide blocking layer.

15. The process of claim 14, wherein the steps of partially etching and etching comprise reactive ion etching using a gaseous mixture including fluorinated etching species and oxygen.

16. The process of claim 15, wherein the step of providing a silicide blocking layer comprises depositing a layer of silicon nitride.

* * * * *